United States Patent [19]

Minnerath et al.

[11] Patent Number: 4,787,472

[45] Date of Patent: Nov. 29, 1988

[54] AUDIO SPEAKER APPARATUS

[75] Inventors: Donald L. Minnerath; Robert J. Minnerath, both of Saco, Mont.

[73] Assignee: Mark Cassel, Saco, Mont.

[21] Appl. No.: 34,653

[22] Filed: Apr. 6, 1987

[51] Int. Cl.[4] .......... H05K 5/00

[52] U.S. Cl. .......... 181/145; 181/147; 181/153; 181/155; 181/199

[58] Field of Search .......... 181/144-147, 181/153-156, 199; 381/87-90

[56] References Cited

U.S. PATENT DOCUMENTS

| | | | |
|---|---|---|---|
| 3,326,321 | 6/1967 | Valuch | 181/144 |
| 4,200,170 | 4/1980 | Williams, Jr. | 181/144 X |
| 4,249,037 | 2/1981 | Dexter | 181/144 X |

*Primary Examiner*—B. R. Fuller

*Attorney, Agent, or Firm*—Arthur L. Urban

[57] ABSTRACT

Audio speaker apparatus includes a chamber portion, a sound generating portion, a sound distributing portion and a positioning portion. The chamber portion includes a generally transverse face section with a housing section extending from adjacent the periperhy of the face section along a centerline of the chamber portion. The housing section includes wall elements converging from the face section. The face section and the housing section form a speaker chamber. The sound generating portion includes a low frequency range speaker mounted adjacent the face section and facing outwardly therefrom. Middle frequency range and high frequency range speakers are mounted adjacent the housing section intermediate the length thereof with the mid-range and high range speakers facing in a direction different from the low range speaker. The sound distributing portion includes a deflecting member disposed directly outside the low range speaker and closely adjacent thereto. The deflecting member includes an apex close to the low range speaker and a wall section with elements diverging from the apex. The positioning portion includes connectors maintaining the deflecting member substantially centered with respect to the low range speaker.

19 Claims, 1 Drawing Sheet

AUDIO SPEAKER APPARATUS

This invention relates to a novel speaker apparatus and more particularly relates to a new apparatus providing a novel arrangement of sound generating and sound distributing components.

With the discovery of sound systems such as radios and phonographs, one of the major concerns was how to distribute the sound to a larger area. Originally, this involved the connecting of a speaker to the radio, record player or other sound generator to distribute the sound throughout a desired space.

As sound systems evolved, the various components such as audio sources, pickups, amplifiers and speakers were refined to reduce extraneous noises, interference and distortion that were contaminating the systems.

A major improvement in sound systems occured when multiple speakers were used. Speakers of different frequency ranges were utilized to deliver purer sound to the listener over a broader frequency range than was possible with a single speaker. Thus, it has become common to use one or more high range, mid-range and low range speakers in combination.

The arrangement of such speakers to provide the best sound has occupied the attention of many experts through the years. Usually, the speakers are arranged adjacent to one another on a single vertical board in one cabinet. With the advent of stereo sound systems, a number of cabinets, containing at least one speaker for each particular frequency range, are positioned around an area to enhance the sound.

Arranging the different frequency speakers on a single board however does not provide distortion-free sound for a listener. One theory is that the higher frequency sounds move faster than those of lower frequencies. With the speakers disposed on a single board, the sounds reach the ears of the listener at different millisecond intervals and thus they are heard as a distorted sound rather than as a pure clear sound.

To reduce such distortion, it has been proposed to turn the speakers so the various frequency sounds are directed initially toward a wall or other flat surface and then reflected to the listener. While this arrangement changes the characteristics of the sound reaching the ears of the listener, it does not provide the desired clarity of sound that serious listeners desire.

From the above discussion, it is clear that past and present speaker systems do not provide clear and distortion-free sound. Thus, there is a need for a new audio sound system that overcomes the deficiencies of earlier systems.

The present invention provides a novel audio speaker apparatus that not only overcomes the shortcomings of previous systems, but also provides advantages and features not found in such systems. Distortion present in current speakers is greatly reduced with the speaker apparatus of the invention. Also, the audio characteristics in general are much purer with the speaker apparatus of the invention.

The audio speaker apparatus of the present invention is simple in design and can be produced relatively inexpensively. Commercially available materials and components can be used in its manufacture. Conventional speaker fabrication techniques can be used by semi-skilled labor to produce the apparatus of the invention.

The speaker apparatus of the invention can be used in different size areas, both small and large, with a high level of performance. Aesthetics do not have to be sacrificed in locating the speaker apparatus in order to achieve the superior performance.

The design of the audio speaker apparatus of the invention can be modified to meet specific acoustic conditions. The speaker apparatus is durable in construction and has a long useful life.

These and other benefits and advantages of the novel audio speaker apparatus of the present invention will be apparent from the following description and the accompanying drawings in which.

Figure 1:
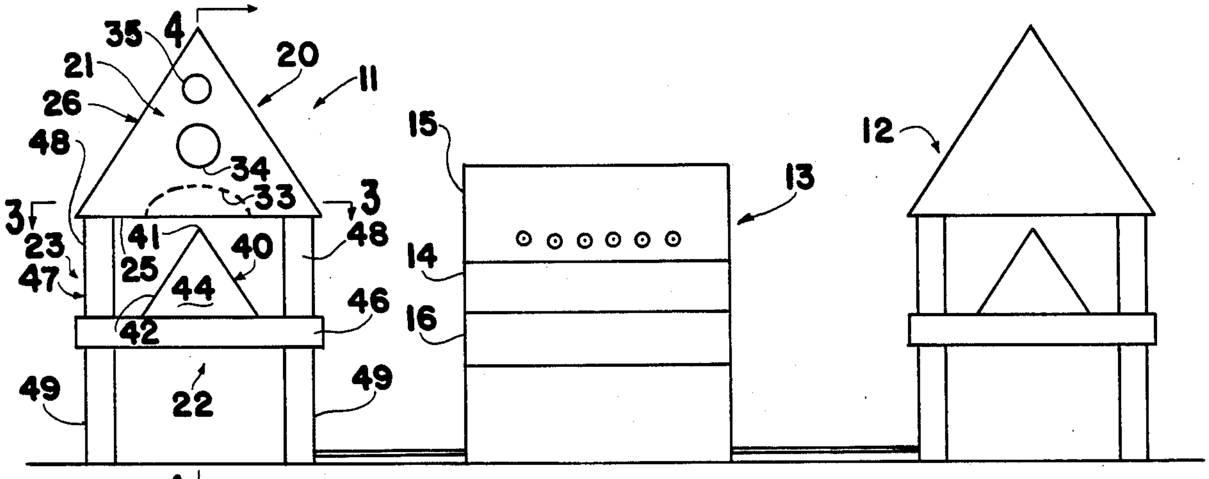
FIG. 1 is a side view of a sound system including a pair of audio speaker apparatus of the invention.
Figure 2:
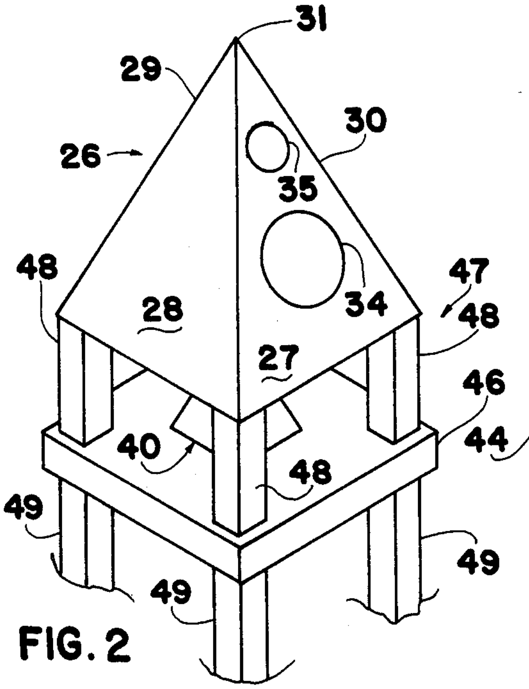
FIG. 2 is an enlarged view in perspective of one form of speaker apparatus as shown in FIG. 1.
Figure 3:
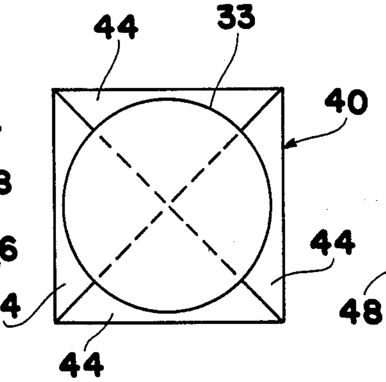
FIG. 3 is a fragmentary sectional view of the speaker apparatus shown in FIGS. 1 and 2 taken along line 3—3 of FIG. 1.

As shown in FIGS. 1-4 of the drawings, one form of novel audio speaker apparatus 11 of the present invention is shown in use with a second audio speaker apparatus 12 spaced therefrom. The speaker apparatus 11 and 12 are connected electrically to a sound system control center 13 that includes conventional components such as disc and tape players 14, radios 15, amplifiers 16, etc. The audio speaker apparatus 11 includes a chamber portion 20, a sound generating portion 21, a sound distributing portion 22 and a positioning portion 23.

The chamber portion 20 of the audio speaker apparatus 11 of the invention includes a generally transverse face section 25. A housing section 26 extends from adjacent the periphery of the face section along a centerline of the chamber portion. The housing section includes wall elements converging from the face section 25. The face section and the housing section form a speaker chamber.

Advantageously, the chamber portion 20 includes a plurality of wall elements 27, 28, 29 and 30 forming a pyramid. Preferably, the face section 25 has a square configuration. The wall elements 27-30 advantageously are interconnected to form an apex 31. Each of the wall elements preferably has a triangular configuration as shown in the drawings.

The triangular wall elements 27-30 are shown as equilateral triangles. Assembling triangles of this configuration into a pyramid, the wall elements will be inclined at about 56° to the horizontal. Alternatively, the angulation of the pyramid may be changed somewhat, e.g. advantageously up to about five to ten degrees or so in either direction by changing the angles of the wall elements of which the pyramid is formed.

The sound generating portion 21 of the audio speaker apparatus 11 of the invention includes a low frequency range speaker 35. The speaker 33 is mounted adjacent the face section 25 and directed outwardly therefrom.

Middle frequency range speaker 34 and high frequency range speaker 35 are mounted adjacent the housing section along the length thereof. The mid-range and high range speakers face in different directions from the low range speaker 33.

Figure 4:
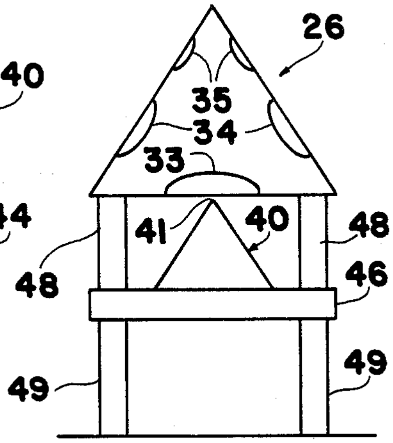
FIG. 4 is a sectional view of the speaker apparatus shown in FIGS. 1 and 2 taken along line 4—4 of FIG. 1.

The mid-range and high range speakers 34 and 35 advantageously are directed outwardly through openings 36 in the housing section 26. Preferably, the sound generating portion 21 includes a plurality of mid-range and high range speakers as shown in FIG. 4.

The sound distributing portion 22 includes a deflecting member 40. The deflecting member 40 is disposed directly outside the low range speaker 33 and closely adjacent thereto. The deflecting member 40 includes an apex 41 close to the low range speaker. A wall section 42 also is included which diverges from the apex 41.

Advantageously, the deflecting member 40 of the sound distributing portion is aligned vertically below the low range speaker 33. The deflecting member 40 preferably has the same general configuration as the chamber portion 20. The deflecting member advantageously is of a size between about one-third and two-thirds that of the chamber portion. Most preferably, the deflecting member is of a size approximately one-half that of the chamber portion.

The apex 41 of the deflecting member advantageously is spaced from face section 25 a distance less than about one-half the length of the deflecting member. The sound distributing portion 22 preferably includes a generally transverse base section 46. The base section 46 is located remote from the apex 41 of the deflecting member 40.

The base section advantageously is of substantially the same configuration and dimensions as the face section 25 of the chamber portion. The deflecting member 40 most preferably is a pyramid that includes the same number of wall elements 44 as the chamber portion 20 and is aligned therewith.

The positioning portion 23 of the audio speaker apparatus 11 of the invention includes connecting means 47. The connecting means 47 maintains the deflecting member 40 substantially centered with respect to the low range speaker 33.

The connecting means 47 advantageously includes connector members 48. The connector members extend between the chamber portion 20 and the sound distributing portion 22. The connector members 48 preferably extend between the face section 25 and the base section 46 and most preferably adjacent corners thereof.

Figure 5:
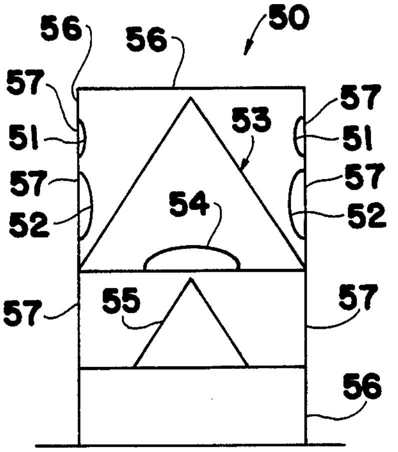
FIG. 5 is a sectional view of another form of speaker apparatus of the invention.
Figure 6:
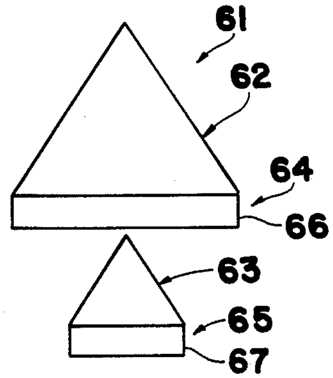
FIG. 6 is a fragmentary side view of a further form of speaker apparatus of the invention.
Figure 7:
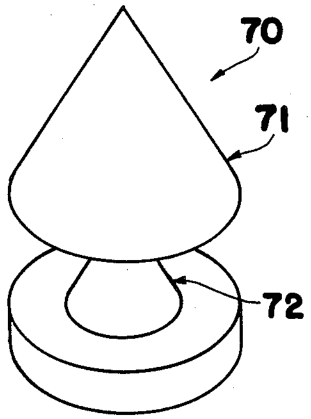
FIG. 7 is a fragmentary view in perspective of an additional form of speaker apparatus of the invention.

The design of the audio speaker apparatus of the invention may be changed from that of apparatus 11 described above to meet specific conditions or requirements. Examples of other designs are illustrated in FIGS. 5, 6 and 7. As shown in FIG. 5, speaker apparatus 50 includes high frequency range and mid-range speakers 51 and 52 which may be mounted outside housing section 53. With this arrangement, the apparatus 50 including a low frequency speaker 54 and a deflecting member 55 can be enclosed within a box shaped exterior 56 with speaker cloth 57 covering areas through which sound distribution is achieved.

In FIG. 6 is shown a speaker apparatus 61 of the invention including a housing section 62 and a deflecting member 63. The housing section and the deflecting member are pyramids that differ from the same components of the speaker apparatus 11 in that each pyramid includes a lower shallow box section 64 and 65 respectively with vertical sidewalls 66, 67.

FIG. 7 illustrates a speaker apparatus 70 that includes a housing section 71 of a conical configuration. Also, deflecting member 72 has a similar conical configuration but of a smaller size.

In the use of the audio speaker apparatus 11, as well as speakers 50, 61 and 70 of the present invention, the apparatus is assembled by combining the wall elements 27–30 with face section 25 into a housing section 26. The mid-range speaker or speakers 34 and the high range speaker or speakers 35 are mounted adjacent to the housing section. The low range speaker 33 is mounted in the face section facing downwardly.

The deflecting member 40 is positioned adjacent the low range speaker 33 with the apex 41 thereof closest to the speaker. This may be accomplished with connector members 48 or using other connecting means 47 e.g. cables (not shown) such as when the speaker apparatus is suspended from a ceiling or a framework.

The assembled speaker apparatus which may include legs 49 is used either singly or more preferably in pairs as shown in FIG. 1. The speaker apparatus are positioned in a room advantageously close to the corners and are connected electrically to a control center 13.

The speaker apparatus can be used in the same manner as conventional speakers. The sound from the speaker apparatus of the invention is purer, clearer and more free of distortion than commercially available speakers, even highest quality speakers. The speaker apparatus can be arranged in different locations within a room or area without adversely affecting the audio characteristics.

The above description and the accompanying drawings show that the present invention provides a novel audio speaker apparatus which not only overcomes the shortcomings of previous speakers but also provides features and advantages not found in such speakers. The speaker apparatus is unique in appearance and pleasing to the eye. Aesthetics do not have to be sacrificed in placement of the apparatus. Superior performance is achieved in a variety of locations both in small and large rooms and areas.

The speaker apparatus of the invention is simple in design and can be produced relatively inexpensively. The apparatus can be fabricated from conventional commercially available materials and components using industry accepted speaker cabinet manufacturing methods. The apparatus is durable in construction and has a long useful life. The design of the speaker apparatus can be modified to meet special acoustic conditions.

It will be apparent that various modifications can be made in the particular speaker apparatus described in detail above and shown in the drawings within the scope of the present invention. The size, configuration and arrangement of portions and components can be changed to meet specific requirements. The appearance of the apparatus can be changed through the use of decorative panels and speaker cloth. The speaker apparatus can be positioned by mounting or suspending it from base surfaces, walls, ceilings, framework and similar supports. The deflecting member may be of a different configuration from that of the housing section, if desired. These and other changes can be made in the speaker apparatus of the invention provided the operation and functioning thereof are not adversely affected. Therefore, the scope of the present invention is to be limited only by the following claims.

What is claimed is:

1. Audio speaker apparatus including a chamber portion, a sound generating portion, a sound distributing portion and a positioning portion; said chamber portion including a generally transverse face section, a housing section extending from adjacent a periphery of said face section along a centerline of said chamber portion, said housing section including wall elements converging from said face section and interconnected to form an apex, said face section and said housing section forming a speaker chamber with an enclosed upwardly extending apex; said sound generating portion including a low frequency range speaker mounted adjacent said face section and facing outwardly therefrom and extending into an area of the converging wall elements of said housing section, middle frequency range and high frequency range speakers mounted adjacent said housing section along the length thereof, said mid-range and high range speakers facing in a direction different from said low range speaker; said sound distributing portion including a deflecting member disposed directly outside said low range speaker and closely adjacent thereto, said deflecting member including an apex close to said low range speaker and a wall section with elements diverging from said apex; said positioning portion including connecting means maintaining said deflecting member substantially centered with respect to said low range speaker.

2. Audio speaker apparatus according to claim 1 wherein said chamber portion includes a plurality of wall elements forming a pyramid.

3. Audio speaker apparatus according to claim 1 wherein said chamber portion includes wall elements forming a cone.

4. Audio speaker apparatus according to claim 1 wherein each of said wall elements has a triangular configuration.

5. Audio speaker apparatus according to claim 2 wherein said face section has a square configuration.

6. Audio speaker apparatus according to claim 1 wherein said sound generating portion includes a plurality of mid-range and high range speakers.

7. Audio speaker apparatus according to claim 1 wherein said mid-range and high range speakers extend outwardly through openings in said housing section.

8. Audio speaker apparatus according to claim 1 wherein said mid-range and high range speakers are mounted completely outside said speaker chamber of said housing section and adjacent thereto.

9. Audio speaker apparatus according to claim 1 wherein said deflecting member of said sound distributing portion has the same general configuration as said chamber portion.

10. Audio speaker apparatus according to claim 1 wherein said deflecting member is of a size between about one-third and two-thirds that of said chamber portion.

11. Audio speaker apparatus according to claim 1 wherein said deflecting member is of a size approximately one-half that of said chamber portion.

12. Audio speaker apparatus according to claim 1 wherein said apex of said deflecting member is spaced from said face section a distance less than about one-half the length of said deflecting member.

13. Audio speaker apparatus according to claim 1 wherein said sound distributing portion includes a generally transverse base section located remote from said apex of said deflecting member.

14. Audio speaker apparatus according to claim 13 wherein said base section is of substantially the same configuration and dimensions as said face section of said chamber portion.

15. Audio speaker apparatus according to claim 2 wherein said deflecting member is a pyramid including the same number of wall elements as said chamber portion and is aligned therewith.

16. Audio speaker apparatus according to claim 1 wherein said positioning portion includes connector members extending between said chamber portion and said sound distributing portion.

17. Audio speaker apparatus according to claim 16 wherein said connector members extend between said face and base sections.

18. Audio speaker apparatus according to claim 17 wherein said connector members extend between adjacent corners of said face and base sections.

19. Audio speaker apparatus according to claim 1 wherein said deflecting member of said sound distributing portion is aligned vertically below said low range speaker.

* * * * *